United States Patent
Nielsen et al.

(10) Patent No.: US 11,075,093 B2
(45) Date of Patent: Jul. 27, 2021

(54) ASSEMBLY OF A CARRIER AND A PLURALITY OF ELECTRICAL CIRCUITS FIXED THERETO, AND METHOD OF MAKING THE SAME

(71) Applicant: CARDLAB APS, Herlev (DK)

(72) Inventors: Finn Nielsen, Copenhagen (DK); Henning Bonde Nielsen, Ringsted (DK); Robert Bernt Giedenbacher, Herlev (DK)

(73) Assignee: CARDLAB APS, Herlev (DK)

( * ) Notice: Subject to any disclaimer, the term of this patent is extended or adjusted under 35 U.S.C. 154(b) by 0 days.

(21) Appl. No.: 16/495,622

(22) PCT Filed: Mar. 23, 2018

(86) PCT No.: PCT/EP2018/057460
§ 371 (c)(1),
(2) Date: Sep. 19, 2019

(87) PCT Pub. No.: WO2018/172525
PCT Pub. Date: Sep. 27, 2018

(65) Prior Publication Data
US 2020/0027753 A1 Jan. 23, 2020

(30) Foreign Application Priority Data
Mar. 24, 2017 (DK) .......................... PA 2017 70214

(51) Int. Cl.
*H01L 21/52* (2006.01)
*H01L 21/683* (2006.01)
*H01L 23/12* (2006.01)

(52) U.S. Cl.
CPC .......... *H01L 21/52* (2013.01); *H01L 21/6835* (2013.01); *H01L 23/12* (2013.01);
(Continued)

(58) Field of Classification Search
None
See application file for complete search history.

(56) References Cited

U.S. PATENT DOCUMENTS 3,689,991 A   9/1972  Aird
6,288,904 B1  9/2001  Houdeau et al.
(Continued)

FOREIGN PATENT DOCUMENTS

GB   2047474 A   * 11/1980   ....... H01L 23/49855
WO   WO-2004012896 A1   2/2004

OTHER PUBLICATIONS

International Search Report PCT/ISA/210 for International Application No. PCT/EP2018/057460 dated Mar. 23, 2018.
(Continued)

*Primary Examiner* — Joe E. Schoenholtz
(74) *Attorney, Agent, or Firm* — Harness, Dickey & Pierce, P.L.C.

(57) ABSTRACT

A method of obtaining an elongate carrier (12) to which a plurality of circuits (14) are fixed at their outer portions. The central portions (141) of the circuits are removed while the outer portions remain fixed to the carrier. A circuit (14) is fastened to a carrier (12) where electrical conductors extend from conducting pads of the circuit through holes (121) in the carrier to conducting pads of the carrier on an opposite side of the carrier.

8 Claims, 4 Drawing Sheets

Figure 15:
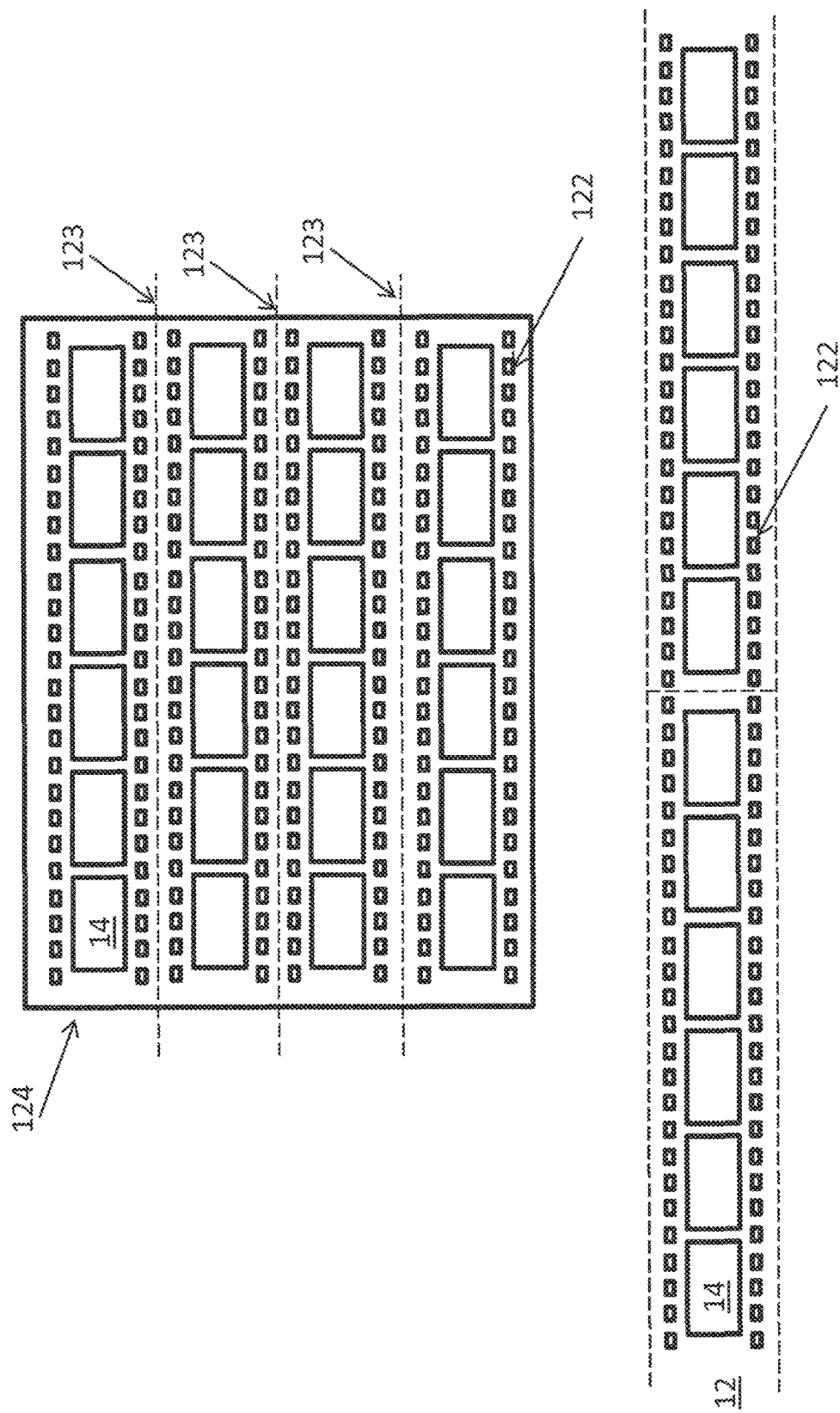

(52) U.S. Cl.
    CPC ............... *H01L 2221/68313* (2013.01); *H01L 2221/68318* (2013.01)

(56) References Cited

U.S. PATENT DOCUMENTS

| | | |
|---|---|---|
| 6,744,120 B1 | 6/2004 | Yanagisawa |
| 2007/0225852 A1 | 9/2007 | Hong |
| 2009/0073632 A1* | 3/2009 | Yang .................. G06K 9/00026 361/220 |
| 2012/0235315 A1 | 9/2012 | Wu et al. |
| 2015/0158649 A1 | 6/2015 | Huang et al. |

OTHER PUBLICATIONS

Search Report dated Sep. 22, 2017, issued in corresponding Danish Application No. PA-2017-70214.

* cited by examiner

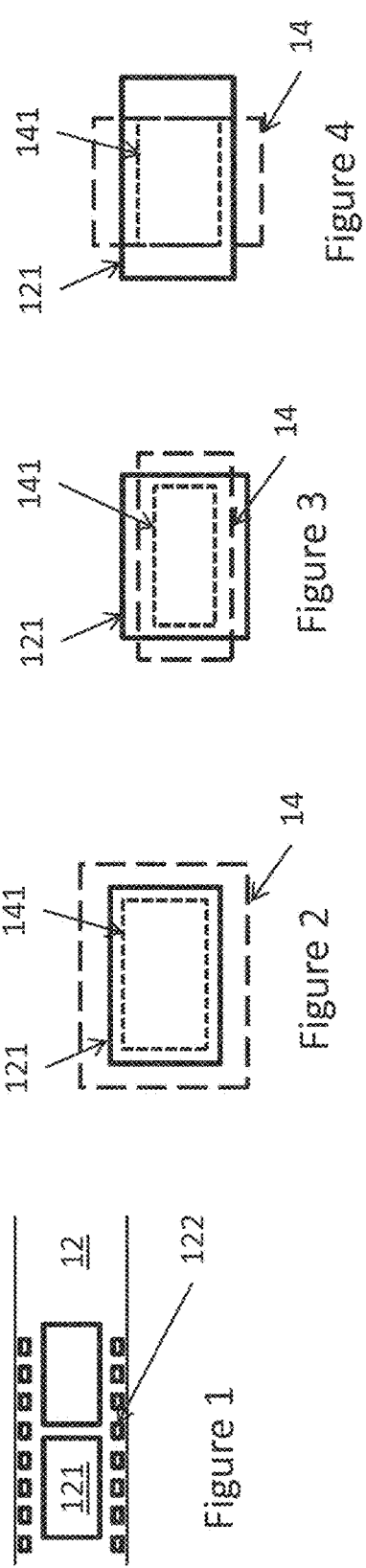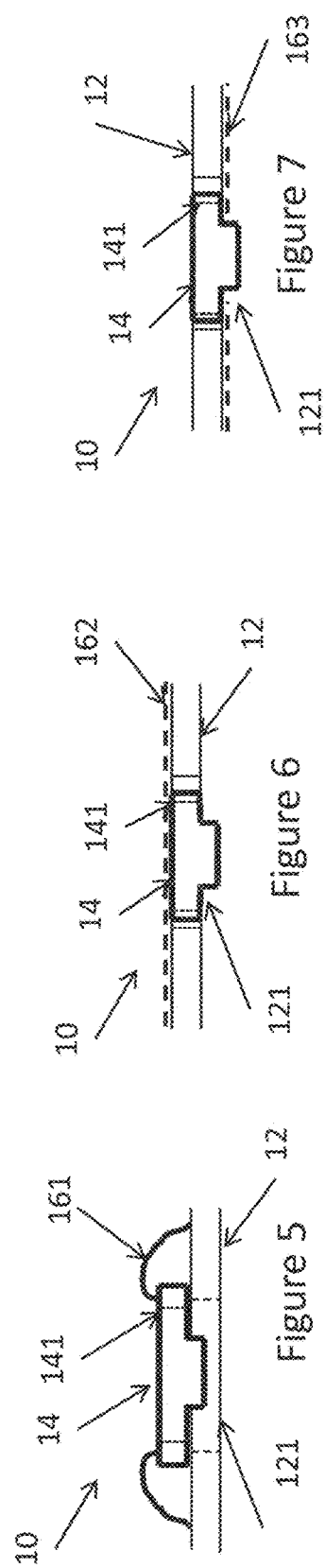

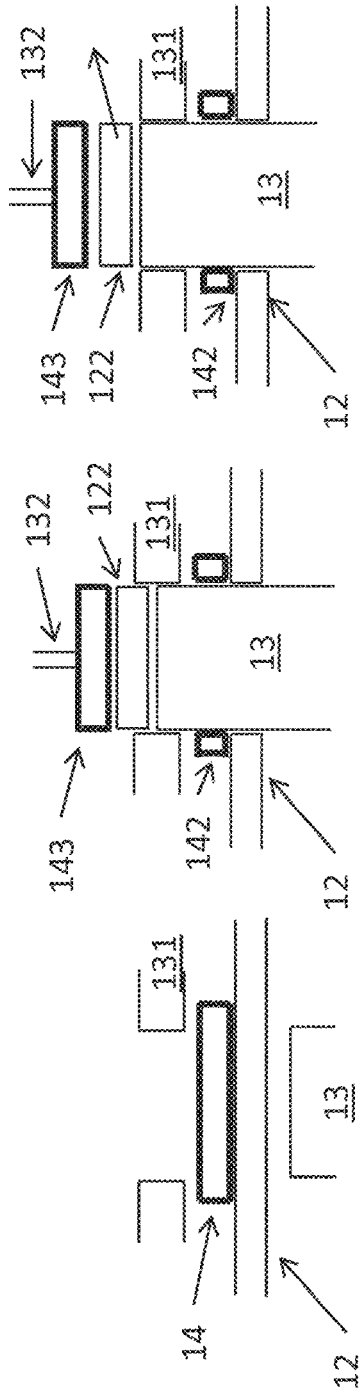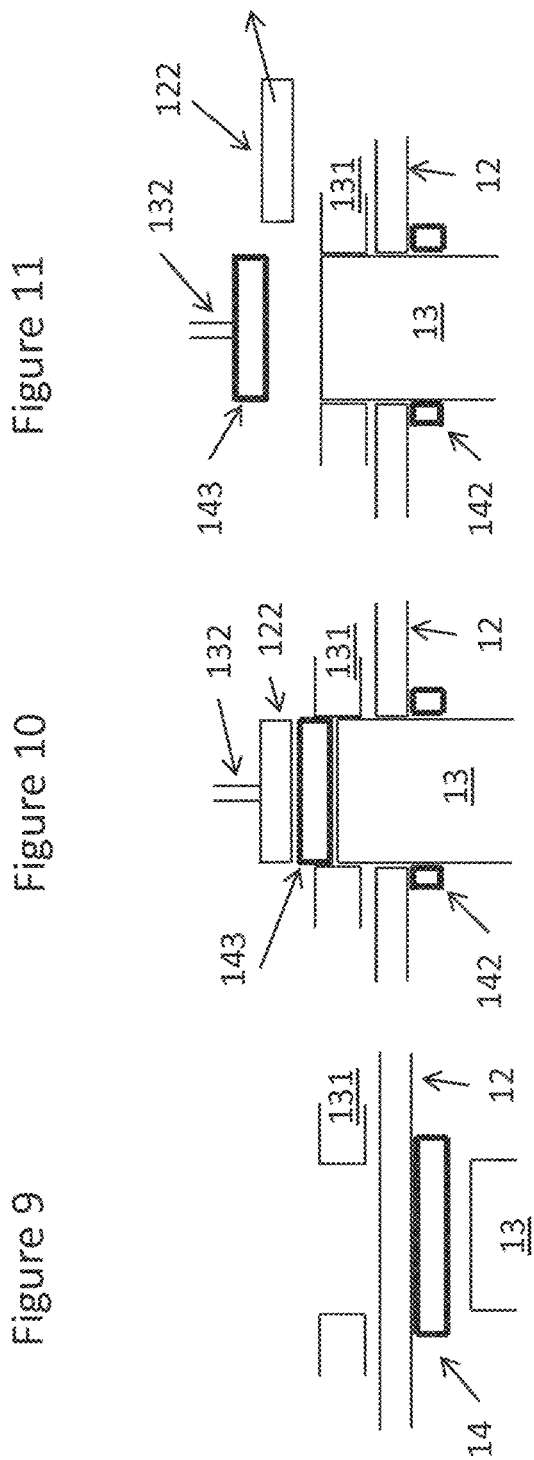

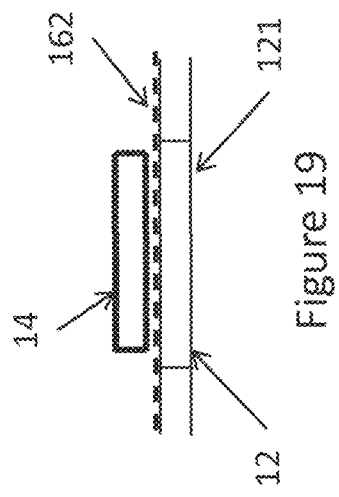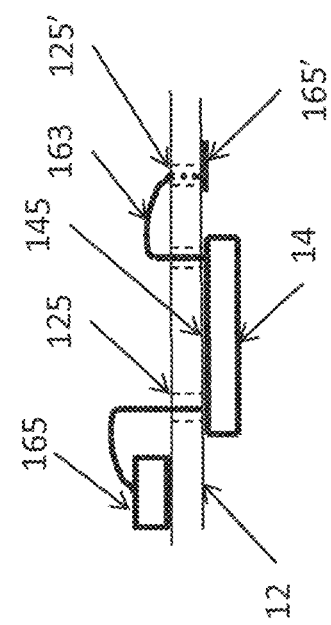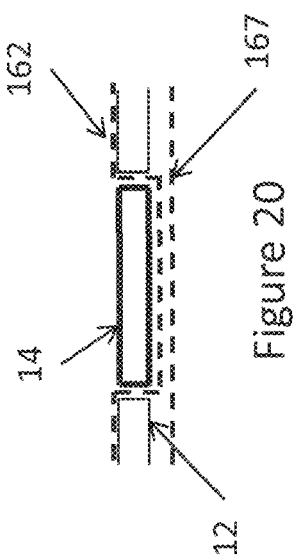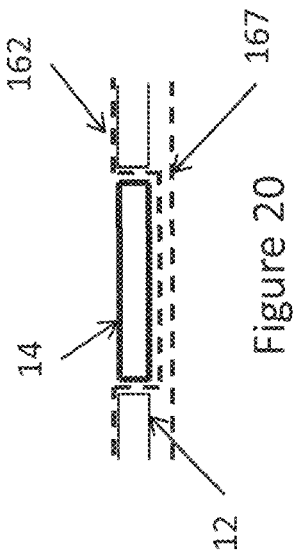

ASSEMBLY OF A CARRIER AND A PLURALITY OF ELECTRICAL CIRCUITS FIXED THERETO, AND METHOD OF MAKING THE SAME

CROSS-REFERENCE TO RELATED APPLICATIONS

This application is a national phase under 35 U.S.C. § 371 of PCT International Application No. PCT/EP2018/057460 which has an International filing date of Mar. 23, 2018, which claims priority to Danish patent application number DK PA 2017 70214 filed Mar. 24, 2017.

The present invention relates to the production of elements comprising electrical circuits where the circuits may be manufactured separately and may be fixed to a holder in order to be more easily transported or engaged at a later assembly step where at least main portions of the circuits are removed from the holder and e.g. attached to other elements.

Often, and for example in relation to chip cards, the industry standard for delivering electronic components, is to deliver the components attached to a flexible band with a width of 35 mm and with a number of equally spaced openings, also called sprocket holes, engageable by a toothed wheel to transport the band. Then, the components may be attached to the band in well-defined positions so that engagement thereof is simple.

However, for some types of circuits, the preferred manner of providing these is individually and in blisters or individual compartments where the circuits are able to move and rotate so that removal of the circuits therefrom is made difficult as the removal and subsequent placement requires determination of the position and rotation thereof.

In a first aspect, the invention relates to a method of providing an assembly, the method comprising:
  obtaining a plurality of electrical circuits each having an outer portion and a central portion,
  obtaining an elongated holder defining a predetermined axis,
  fixing the outer portions of each circuit to the holder and removing the central portions of the circuits from the holder while the outer portions are fixed to the holder.

In the present context, an electrical circuit may be a single circuit, such as a chip/IC/ASIC/processor/RISC processor/DSP/FPGA/memory chip or the like. Alternatively, an electrical circuit may itself be an assembly of electrical circuits or an assembly comprising an electrical circuit. The present electrical circuit may comprise additional elements, such as a PCB, electronic components, one or more sensors, a power supply, one or more antennas, one or more light emitters or light receivers, or the like. Preferably, the circuit is a single element, as this is more easily handled.

The circuits comprise an outer portion and a central portion, where the central portion may be separated from the outer portion. Preferably, all relevant components are present in the central portion. The outer portion may be formed by dispensable portions of e.g. a PCB to which other elements are attached.

In this context, the PCB or other element of the circuit, to which e.g. a chip or other electronic component is fastened to form the circuit, may be flexible, such as made of a polymer or plastic. Naturally, the element could be electrically conducting and be metallic, metallized or partly metallized, if desired. Possible holder materials are metals, such as metal foils, stainless steel, but naturally also plastics, PVC, PET, PEX, PEC, PTB, PP, PA, paper, FR4, PI, Capton, Polymer film, aluminium foil, or etched copper clad. The same materials may be used for the holder.

In this context, a plurality is at least two circuits, but often, 5, 10, 50, 100, 500 or more are fixed to the same holder, which may be flexible and wound onto a bobbin or the like after fixing and removed from the bobbin before or during the removal step.

An elongated element usually is an element which extends further in a predetermined direction compared to the directions of a plane perpendicular thereto. In the present context, an elongate element may extend, along the predetermined direction, at least 10 times, such as at least 50 times, such as at least 100 times that along any dimension perpendicular to the predetermined direction. For example, a band may be 10 meters long, 4 cm wide and 1 mm thick, where the 10 meters is along the predetermined direction and the 4 cm and 1 mm along directions perpendicular to the predetermined (longitudinal) direction.

Preferably, the elongate holder is flexible and thus bendable. In that manner, the holder may be wound on to e.g. a bobbin before and/or after fixing thereto of the circuits. In that manner, the holder may be more easily transported from e.g. factory to factory or between different sites in a factory.

A flexible material may have a shore D hardness of 300 or less, such as 200 or less, such as 100 or less. It may be desired that the flexible material has a hardness corresponding to or adapted to the hardness of other materials, such as the below card body. The material may comply to the ISO 7810 bending and torsion requirements.

The predetermined axis preferably is a symmetry axis along which the holder extends the farthest (longitudinal axis).

In one embodiment, the holder has a length (longest dimension) of at least 1 m, such as at least 5 m, such as at least 10 m, such as at least 20 m. A largest dimension perpendicular to the predetermined axis, which may be a width if the holder is flat, may be no more than 20 cm, such as no more than 10 cm, such as no more than 5 cm. A widely used standard band may have a width of approximately 35 mm.

The smallest dimension of the holder, such as a thickness thereof, may be 5 mm or less, such as 2 mm or less, such as 1 mm or less, such as 0.5 mm or less, such as 0.25 mm or less, such as 0.2 mm or less.

In the present context, the fixing may be a detachable fixing allowing the circuit to be completely removed from the holder if desired. Alternatively, the fixing may be permanent or at least not intended to be detached, as the central portion of the circuit is removed from the outer portion which is attached to the holder. Thus, it may not be relevant or desired to remove the outer portions from the holder before or after the removing step.

In this connection, preferably the central portion is not fixed to the holder, at least when removed or detached from the outer portion. Thus, the central portion may be fixed to the holder only via the outer portions. The central portion may be attached only to the outer portion.

The removal may be performed in any desired manner. Typically, the central portion will be removed from the outer portion, such as by detaching the central portion from the outer portion. The central and outer portions may be detachably attached to each other, or the removal step may comprise a permanent detachment of the central portion from the outer portion. The removal step thus may comprise a cutting, stamping-out, severing, tearing or other operation separating the central portion from the outer portion.

An advantage of this and other aspects of the invention is that removal of the central portion may define a precise position of the central portion. Thus, exact indexing thereof is possible, as is engagement thereof and thus any later positioning or handling thereof.

The outer portion may thus remain attached to the holder, or it may be removed from the holder at a subsequent point in time.

It is noted that the fixing step may comprise fixing individual circuits to the holder sequentially or a number at the time, and/or that the removal step may comprise sequential removal of the central portions or removal of a number of the central portions at the time.

Often, the processing of long holders, such as band, may be reel-to-reel, where whatever processing takes place sequentially for sequential portions of the holder, such as attachment of elements thereto, removal of elements therefrom.

In general, bendability of the assembly is desired. Thus, preferably, the circuits, or at least the central portions, in the predetermined direction, are either bendable or have an extent of no more than 5 cm, such as no more than 4 cm, such as no more than 3 cm, such as no more than 2 cm. The outer portions may be more bendable than the central portion, as they may not comprise anything other than a (dispensable or sacrificial) basis or layer used for fixing the central portion to the holder. Thus, it may not even be a problem if bending affects the outer portions as long as the bending does not cause the central portions to be detached from the holder.

The circuits may be fixed to the holder equidistantly along the predetermined direction in a single row or file or in multiple rows or files.

In one embodiment, the holder comprises a plurality of equally spaced markings positioned along a longitudinal axis parallel to the predetermined axis and wherein each electronic circuit is positioned in a predetermined manner in relation to a respective marking.

The markings may be provided in the holder before, during or after the fixing step.

These markings may be visible elements determinable by a vision system or elements detectable by a tactile system, such as elements determinable by their electrical conductivity (localized, metalized areas) or elements which may be used for determining or directly controlling a position of the holder in relation to e.g. a fixing and/or removal system.

Preferably, the markings are indentations or holes, often called sprocket holes, which may be used by a positioning system for determining the position of the holder. A preferred manner is to provide one or more toothed wheels or infinite carriers capable of engaging the markings and use the markings to translate the holder in relation to the wheels/carrier or an apparatus for e.g. fixing the circuits to the holder and/or removing the central portions from the holder.

In this manner, knowledge or controlling of the relative positions of the markings will determine the positions of the holder and thus may assist in relative positioning of the circuits and the holder. Information may be derived as to a position of a marking. When the circuit is fixed or to be fixed in relation to that marking, the desired position of the circuit may be derived.

The positions of the markings may be controlled by controlling the e.g. toothed wheel or band/belt, as may a movement or translation of the markings and thus the holder with or without the circuits.

In one embodiment, the removal step comprises severing the central portions from the outer portions along a direction perpendicular to a plane of the holder. Severing may be any type of detachment or dividing of the circuit to detach or separate the central portion from the outer portion. Preferably the severing is along a line or direction perpendicular to the plane, such as a direction perpendicular to a plane of the circuit. The plane may be a plane wherein the circuit or holder has the largest cross section and/or a plane parallel to a surface of the holder and/or circuit.

Naturally, a contour may be determined separating the central portion and the outer portion. This contour may be determined in a plane parallel to e.g. a plane of the circuit. The severing may be performed along this contour.

A number of severing methods are known, such as punching-out, laser cutting, cutting using a knife or a pair of scissors. Also, the circuit may comprise a pre-scoring or a perforation, for example, defining a weak line or curve to ensure that the severing takes place at the desired limit or boundary between the central portion and the outer portion. With pre-scoring, the severing may be a pulling of the central portion in relation to the outer portions or a pressing out of the central portion relative to the outer portions.

Thus, in one situation, the removing step comprises punching out the central portion of each electrical circuit.

Then, the severing or punching-out could comprise severing or punching-out also a portion of the holder at each central portion. Thus, the severing/punching out the central portion could also be a severing or punching-out of a portion of the holder. This may be the situation when the severing/punching out is performed through both the circuit and the holder, and when the holder exists also at the desired boundary between the central portion and the outer portion. When a portion of the holder is then severed from the remainder of the holder, the method may comprise the step of removal/discarding of the portion of the holder.

The removal/discarding may be performed in a number of manners. If the holder portion is loose and/or freely movable, it may simply be blown away from the holder or central portion, or a slanted surface may be used for allowing the holder portion to slide away. Naturally, an apparatus or a portion of an apparatus may also be used for removing and/or discarding the holder portion. Further below, other manners of removing the holder part are described.

In one embodiment, the method further comprises the step of, pursuant to the severing/punching step, engaging the central portion by an instrument. Instruments of this type may be able to grab the central portion and/or attach thereto. In one situation, the instrument may be a suction instrument such as a so-called vacuum tweezers or a vacuum cup, which are routinely used in pick an place operations in the electronics industry. Suction elements or tools have the advantage that they do not scratch, bend or damage the central portions easily.

When an instrument is used for engaging the central portions, this element may also be used for removing/discarding the holder portion in the removing/discarding step. The same instrument may be used for both steps, or different instruments may be used for engaging the central portion and the holder portion, respectively.

In one situation, the instrument engages each central portion from a first side of the holder, and wherein the removal/discarding step is performed before the engaging step. Then, the severed/punched-out central portion and the holder portion may be positioned, relative to each other, with the holder portion closer to the instrument, so that the holder portion is removed, before the instrument can engage the central portion.

In another situation, the instrument engages each central portion from a second, often opposite, side of the holder, and wherein the removal/discarding step is performed subsequent to the engaging step. Thus, the relative positions may be so that the central portion is the easiest to engage first.

In one embodiment, as described above, the holder further comprises a plurality of cavities or holes. The cavities/holes are preferably provided before the fixing step. In this embodiment, the fixing step comprises fixing each circuit in or at a cavity or hole. The circuits may each be fixed inside a cavity/hole or above it. The circuits may be positioned in the cavity/hole, may completely fill or cover a cavity/hole or may extend beyond the cavity/hole, such as if having, in a plane of the holder and/or circuit, a contour having portions extending outside of a contour of the hole/cavity.

One advantage may be seen when a contour of the central portion of a circuit falls completely within a contour of the cavity/hole and especially a hole. In that situation, the central portion may be separated from the outer portions even by punching-out without engaging or removing part of the holder. In that situation, the above holder portion is avoided, as is any removal/discarding thereof.

Another advantage may be seen during the actual fixing step, if the fixing e.g. is obtained by providing a glue or the like on a surface of the holder, such as at least at positions in the vicinity of a cavity/hole. Then, even if the glue or the like is provided over all of the surface of the holder, the glue or the like may not contact the central portion of the circuit when it is positioned over the cavity or hole. Thus, the providing of a glue need not be precise.

Again, when the cavities/holes are positioned in a known manner in relation to the markings, the positions thereof will be known when the positions of the markings are known. This facilitates the relative positioning of the circuits and cavities/holes during the fixing step. Also, knowledge of the positions of the cavities/holes may aid in the providing of glue or other fixing means (see below) used for fixing the circuits to the holder.

In one embodiment, the fixing step comprises gluing each circuit to the holder. Gluing may be performed by adding glue between the holder and the circuit. The glue may be a liquid or fluid or may be provided in the form of e.g. an adhesive tape (such as a double sided adhesive tape). The glue may be provided at an interface between the holder and the circuit, such as at edges of the circuit as it is seen in top globing where the glue lies on top of the elements and not necessarily between the elements.

Another manner may be to have the fixing step comprise wire-bonding each circuit to the holder. Usually, wire bonding is used for providing electrical connection between e.g. a chip and a PCB, but the same technology may be used for attaching the circuit to the holder. Metallic wires or bands may be attached to the circuit and the holder to fix the circuit in relation to the holder. Naturally, further methods are known for fixing two elements to each other, such as by welding or soldering. When the outer portions have the purpose of only fixing the central portion to the holder, the outer portions may simply be welded, such as laser welded, to the holder. This may locally destroy a structure of the outer portions, but this may be acceptable, such as if the deformation or heat applied does not impact the central portion.

Instead of wires, other, relatively stiff, elements may be fixed to the circuit and the holder to fix the circuits to the holder.

In yet another alternative, the fixing step comprises press-fitting each circuit to the holder, such as in a hole or indentation/cavity thereof. Alternatively, the holder may comprise ridges or protrusions between pairs (or more) of which the circuit may be received and fixed.

As mentioned, the fixing step could comprise attaching a tape to the holder and the circuits. This tape may be provided between the holder and the circuit or it may be attached to the holder and extend also over the circuit, as is usual when fixing things with tape.

Naturally, combinations of different fixing techniques may be used if desired.

In one situation, where a tape is used, the attaching step could comprise locally activating the tape at positions of engagement of the tape and the circuits and positions of engagement of the tape and the holder.

This embodiment may be interesting when the tape can be activated to become sticky or at least more sticky than when not activated. A number of heat activatable tapes are available which are widely used for e.g. fixing circuits in card bodies of intelligent credit cards.

Other tape types or glue types may be activated by applying pressure, UV/IR radiation or even water/fluid.

Tapes of these types may be Heat Activated Foils (HAF), Pressure Sensitive Tape (PSA), double-sided tape Thus, the tape may be provided over e.g. a surface of the holder at which it is desired to fix the outer portions to the holder. Then, the tape may be activated (preferably heated) where after the holder and circuit are attached to each other via the tape.

Alternatively, the tape may be attached to the holder at some positions and to the circuit at other positions.

Also, the tape may be activated to be fixed to the central portion of the circuit and thus at positions where the tape is usually not supposed to fix to the holder. This may be in order to fix the tape to the central portion also after removal of the central portion. Further below, the fixing of the removed central portion to another element is described. This fixing of the tape to the central portion will, when the tape is also severed when the central portion if removed, keep a portion of the tape attached to the central portion so that it may later be positioned correctly and be used for fixing the central portion to e.g. a card body.

It is noted that some tapes may be activated multiple times so that an area of the tape may be made sticky again or more sticky by a later activation. For such tapes, the same areas may be used for attaching to the central portion and later to another element such as a card body.

If a tape can only be activated once, different areas thereof may be used for attaching to the central portion and later to the card body.

Naturally, this use of a tape may be employed irrespective of how the circuit is fixed to the holder and/or the card body.

In one embodiment, the method thus further comprises the step of, pursuant to the removing step, attaching each central portion of a circuit to a respective card body or other body where high precision positioning is desired. Naturally, this may be obtained in any desired manner. Glue may be used, as may lamination.

A protective layer may be provided for protecting the tape and extend its shelf life.

However, it is preferred that the attaching step comprises:
  positioning a tape between the circuit and the card body and activating portions of the tape.

Naturally, this tape may be that described further above, so that the tape is fixed to the central portion before central portion is assembled with the card body. It may be advantageous to add the tape to the circuits before removal from the holder, where the positions of the circuits are known and where the circuits are fixed to the holder. This makes it easier to control the relative positions of the tape and the circuits, such as if the tape is contoured or has openings which should be positioned precisely in relation to the central portions.

Alternatively, the tape may be fixed to the card body before the assembly—or simply provided between the central portion and the card body without fixing to either of them.

A second aspect of the invention relates to an assembly of an elongated holder and a plurality of circuits obtained by the first steps of the method of any of the aspects and embodiments of the invention.

A third aspect of the invention relates to an elongated, flexible/bendable element comprising:
  an elongated holder defining a predetermined axis,
  a plurality of electrical circuits each having a central portion and an outer portion, each circuit being fixed to the holder only at its outer portions.

In this context, a flexible/bendable element may be an element capable of being bent into a circle with a diameter of 30 cm or less, such as 20 cm or less, such as 10 cm or less without breaking, such as without permanent deformation. Further above, materials suitable for use as the holder are described.

The holder and the circuits may have the characteristics described above.

In one embodiment, as is also described above, the holder comprises a plurality of equally spaced markings positioned along a longitudinal axis parallel to the predetermined axis and where each electronic circuit is positioned in a predetermined manner in relation to a respective marking. In this manner, determination or control of a position of a marker will determine or control the position of the holder before the fixing step or the circuit after the fixing step.

The different types of markers are described further above. It is noted that a number of band types with equidistant holes, typically called sprocket holes, interacting with a toothed wheel much like a chain and a toothed wheel. Usually, the markings are provided at both outer, longitudinal sides of the holder so that even traction over the width thereof may be obtained.

Again, the holder may further comprise a plurality of cavities or holes, and wherein each circuit is fixed in or at a cavity or hole. Again, the circuit may be fixed inside or across the hole/cavity, and the contours of the cavity/hole and the central portion may be so that the central portion is positioned over the cavity/hole.

Preferably, the cavities/holes are positioned equidistantly, or at least at known positions, along a predetermined axis and wherein the markings are positioned along a longitudinal axis parallel to the predetermined axis. This makes it easier for machinery to sequentially fix and/or remove the circuits to/from the holder. Naturally, the positions of the cavities/holes may be determined in any manner. Visual/tactile detection is widely used, and if sprocket holes are used, the position determination is simple.

Then, the cavities/holes may be positioned with a first predetermined distance, and wherein the markings are positioned with a second predetermined distance, the first predetermined distance being an integer of the second predetermined distance.

Preferably, each circuit is positioned in a predetermined manner in relation to a respective one of the markings. Again, this facilitates providing an automatic process for the fixing/removal, as this machine needs only know the position of a marking to know the position of—or desired position of—a circuit or central portion.

Many manners of fixing a circuit to the holder are known. Thus, a circuit may be glued to the holder, a circuit may be wire-bonded to the holder, a circuit may be welded to the holder, a circuit may be press-fitted to the holder (such as in relation to a cavity/hole) and/or a tape may be attached to the holder and the circuits.

As mentioned above, the tape may be provided between the outer portions and the holder or on the same side, such as an upper side, of both the circuits and the holder. Then, the tape may be attached to a side of the circuits facing away from the holder—or both sides if the circuit is e.g. press-fitted or glued to the holder.

Naturally, if a tape is used to fix the circuit to the holder but is not desired after removal of the central portion, this tape may be removed subsequent to or in the removal step. If the tape is loose, blowing away could be a possibility. Otherwise, an instrument or apparatus portion may be provided for that purpose.

A fourth aspect of the invention relates to a method of obtaining an elongate carrier with a plurality of circuits, the method comprising:
  providing a sheet-shaped element,
  providing a plurality of circuits,
  fixing each circuit to the sheet-shaped element,
  dividing, subsequent to the fixing step, the sheet-shaped element into a plurality of oblong elements,
  interconnecting the oblong elements to form an elongate carrier.

In this context, an elongate carrier may be the above elongate holder to which circuits are attached. Elongate in this context is described above.

Naturally, all aspects and embodiments described may be combined with each other.

Thus, the circuits may be as the circuits described above, but in this aspect the circuits need not have dispensable outer portions removed from a desired, central portion. In this aspect, the circuits may be only the desired portions, such as what is in the central portions in the above aspects.

Fixing of standard circuits to band-shaped materials are known from the manufacture of chips for chip cards. However, this is in relation to bands and not sheet-shaped elements.

The attaching of chips or circuits to bands and sheet-shaped elements are seen as different processes by the industry.

A sheet-shaped element usually is an element which has two main surfaces and a thickness, along a direction perpendicular to one of the surfaces, which is much smaller than the dimensions of the sheet-shaped element along directions in the plane of a surface. Thus, the thickness may be 5 times, such as 10 times, such as 50 times smaller than a smallest dimension of the sheet in a plane of a surface.

The main surfaces of the sheet-shaped elements may, in a plane of a surface, have an outline as a parallelogram with two sets of parallel sides. The parallelogram may be a rectangle. The sets of sides may have lengths so that the longer of the lengths is 1-10 times the smaller length, such as 1.2-5 times the smaller length. Examples of dimensions of rectangular sheet-shaped elements is 16.6"×10.6", 18"*24" or those of A4 paper sheets.

Often, sheet-shaped elements have parallel first and second main surfaces, as is the situation for e.g. a sheet of paper or plastics.

The sheet-shaped element preferably is bendable or flexible and may be made of the above-mentioned materials proposed for the holder.

The fixing step may be as that described above, as may the fixing methods. However, in this aspect, the circuits need not have the outer portions, and the circuit may be permanently attached to the material of the sheet-shaped element to later, when removed (see below), form an assembly of the circuit and a portion of the sheet material.

Having fixed the circuits to the sheet-shaped element, the sheet-shaped element is divided into a plurality of oblong elements. In this respect, an oblong element may be of the type described above as an elongate element. Sometimes, however, the oblong element may have a length which is only 2-50, such as 3-30, such as 4-20 times the width thereof, where the thickness preferably still is less than 1% of the length or the width.

Preferably, the circuits are fixed to the oblong elements along a direction of a longitudinal direction of the oblong elements such that when the oblong elements are interconnected to each other to form the elongate element, the circuits are fixed thereto along a longitudinal direction also of the elongate element.

Actually, the resulting elongate element or assembly of this aspect of the invention may be that resulting from the first aspect of the invention or that according to the second or third aspects. Also, the shape and properties of the carrier may be as those of the above holder, but where the circuits need not the outer portions but only the later desired portions, called the central portions above, which are fixed to the carrier.

The dividing of the sheet-shaped element into the oblong elements may be performed in any desired manner, such as cutting, laser cutting, breaking or the like. The sheet-shaped element may be pre-scored or have a perforation in order to ensure that the dividing takes place at the desired positions. Preferably, the oblong elements have a contour, in a plane of a main surface thereof, of a parallelogram and preferably a rectangle, where the circuits are positioned along an axis or direction parallel to the longer sides of the rectangle.

The interconnecting step may be obtained in any desired manner, such as by overlaying two adjacent oblong elements with a tape, gluing the oblong elements together, using welding, such as laser welding, or the like. Preferably, the oblong elements are attached so that longitudinal axes thereof are parallel and preferably symmetry axes are overlapping.

Naturally, the interconnecting preferably is selected so that the carrier is bendable at or near the interconnections so that the carrier is bendable.

As described in relation to the first aspect, also the present method preferably further comprises the step of removing the circuits from the elongate carrier.

Again, the fixing and/or removal may be sequential.

Preferably, the oblong elements each comprises a plurality of equally spaced markings positioned along a longitudinal axis parallel to the predetermined axis and wherein each circuit is positioned in a predetermined manner in relation to a respective marking. Thus, the markings may be provided in the sheet-shaped element or after the dividing step.

Naturally, the markings may alternatively be provided after the interconnecting step.

If the circuits, as the first aspects, have a central portion to be removed and outer portions fixed to the carrier, the central portion may be removed while the outer portions are fixed to the carrier. Then, as is described above, the removal step may comprise severing the central portions from the outer portions, such as along a direction perpendicular to a plane of the carrier. The methods and preferences described above are equally relevant in relation to this aspect of the invention.

The removing step may comprise punching out the circuit. This may comprise punching-out along a contour or periphery inside which the circuit is present. Thus, the punched-out circuit may be attached to a portion of the carrier.

In the situation where the circuit comprises the central portion and the outer portions, the severing or punching-out preferably comprises severing or punching-out a portion of the carrier at each circuit and a subsequent removal/discarding of the portion of the carrier. Different manners of discarding/removing the carrier portion are described above.

In one embodiment, the method further comprises the step of, pursuant to the severing/punching step, engaging the central portion by an instrument. Different types of instruments are described further above.

The removing/discarding step may comprise the removing/discarding the portion using the instrument. The instrument may engage each central portion from a first side of the carrier, and wherein the removal/discarding step is performed before the engaging step or the instrument may engage each central portion from a second, opposite, side of the carrier, and wherein the removal/discarding step is performed subsequent to the engaging step.

In one embodiment, the sheet-shaped element further comprises a plurality of cavities or holes, and wherein the fixing step comprises fixing each circuit in or at a cavity or hole. The advantages of the holes/cavities are described above.

Then, the cavities or holes are preferably positioned along one of a plurality of parallel, predetermined axes relative to the carrier and wherein each cavity/hole is positioned in a predetermined manner in relation to a respective marking.

As indicated above, many different fixing techniques may be used, such as gluing, wire-bonding, press-fitting, taping, welding, soldering or the like.

Naturally, the above methods involving activatable tape may also be used in connection with the present aspect. Thus, the attaching step may comprises locally activating a tape at positions of engagement of the tape and the circuits and positions of engagement of the tape and the carrier.

Also, the present method may, as is described above, further comprise the step of, pursuant to the removing step, attaching each circuit to a respective card body, or any other element, such as an RFID element, wherein the attaching step comprises:
positioning the tape between the circuit and the card body and
activating portions of the tape.

Naturally, the portions of the tape may be the whole tape if desired.

As mentioned above, the method may further comprise the step of, pursuant to the removing step, attaching each circuit to a respective card body. As mentioned above, this may be obtained using activatable (or simply standard) tape or the like.

Naturally, the removed circuit may be only the circuit formerly fixed to the sheet-like element, but the circuit often will comprise a portion of the carrier material, when the portion removed comprises not only the actual circuit. Thus, the sheet-like material may comprise therein or thereon other electrical components, such as chips, circuits, SMC components, electrical conductors or the like, which may be, during the fixing step, connected to the circuit and which may be removed, with the actual circuit, from the carrier and subsequently e.g. attached to a card or other body. Then, the fixing step need not only attach the circuit to the sheet-shaped element but may take part in a formation of a more complex circuitry, which is then removed from the remainder of the carrier.

A final aspect of the invention relates to an assembly of a circuit and a carrier element,
the carrier element has:
    a first and a second, opposite side,
    one or more first electrically conducting surfaces, and
    one or more through-going holes from the first side to the second side,
the circuit has one or more second electrical conducting surfaces at a first side thereof, the first side of the circuit facing the second side of the carrier and
one or more electrical conductors each extending from a respective second electrical conducting surface of the circuit, through a respective hole and to a respective first electrically conducting surface.

In this connection, the carrier element may be of any type and of any shape. The carrier element may be an element configured or adapted to be connected to a single circuit, or larger elements may be used, as the above holder/carrier, to which multiple circuits are connected, and which are subsequently divided into portions each comprising one circuit.

Often, the carrier element is a flat or plane element, such as an element having a first and a second main surfaces which are parallel, and a thickness perpendicular to the surfaces which is much lower than the extent in the plane of the surfaces.

The carrier element may simply be a non-conducting element. The carrier element may comprise thereon electrical conductors and thus may be a PCB. Such conductors may be provided on the first side of the carrier element and thus may be one of the first electrically conducting surfaces.

Alternatively, an electronic component, such as a chip, sensor, processor or the like may be provided at the first surface, where a first conducting surface is a surface, such as a contact pad or element of the chip or the like, so that the conducting conductor interconnects the circuit with the chip or the like.

Actually, a first conducting surface may be accessible through another hole or bore of the carrier element and thus be provided on or at the second side of the carrier. Then, the electrical conductor may extend through this other hole/bore to connect to this conducting surface. Thus, a first conducting surface may be a surface of an electrical conductor attached to or fastened to the first side of the carrier element. Alternatively, the first electrical surface may be a surface of another circuit provided at the first surface of the carrier element, where this first conducting surface may be a surface of this other circuit facing the first side of the carrier element.

Thus, the assembly may be single sided in the sense that the first electrically conducting surfaces are provided or accessible only at the first side of the carrier element. Alternatively, the assembly may be double sided such as if the electrical conductors extend through also other holes/bores.

Naturally, the electrically conductors may subsequently be protected by top globing these at least at the first side of the carrier element.

The circuit may be any type of circuit, such as a processor, a controller, a chip, an ASIC, an FPGA or the like. The circuit may comprise multiple such elements. In a particular embodiment, the circuit comprises a sensor.

Preferably, the circuit is a fingerprint reader capable of sensing a finger print of a finger engaging a surface over the first side of the circuit and above the carrier element.

The circuit has one or more second electrically conducting surfaces, such as conducting areas on an outer surface thereof for receiving power and/or for providing an output.

The carrier element has one or more holes or bores which preferably are positioned, relative to the conductors of the circuit, so that each conductor is exposed to the inner space of a respective hole/bore, so that an electrical conductor may extend through the hole/bore and connect to a second conducting surface of the circuit.

The conductors may be any type of element, such as a thin rod or wire of a metal or other conductive material. The present assembly is simple to obtain using standard wire-bonding equipment.

The conductor may be attached or connected to the conducting surfaces using welding, soldering, gluing or the like.

In one embodiment, the circuit is fixed to the carrier element. This fixing may be obtained using glue. The glue may be provided between the circuit and the carrier element or may be provided over an or at an outer surface of the interface between the circuit and carrier element much in the way top globing may be used. Also fixing using tape or the like may be used. All the above-mentioned fixing methods may in principle be used.

In fact, the conductor(s) may itself or themselves fix the circuit to the carrier element.

Under all circumstances, the fixing of the circuit to the carrier preferably is a resilient fixing which allows the circuit to move slightly in relation to the carrier so that the assembly may be bent slightly without destroying the circuit, the carrier and the electrical connections between the first and second surfaces. If a glue is used for the fixing, a glue with a slight resilience may be selected.

In one embodiment, the circuit is a sensor. This sensor may be e.g. a biometric sensor. A preferred sensor type is a fingerprint sensor which may be desired used in intelligent cards.

Some finger print sensors are capable of sensing a finger print even through the carrier element. In that situation, the second electrically conducing surfaces are preferably provided at extreme portions of the first surface of the circuit where a sensitive portion thereof is the provided at a central position between the second conductive surfaces and extreme portions.

Then, the holes and electrical conductors may be provided at or above the extreme portions and not over the sensitive portion. When projected on to a plane of the second surface of the circuit, the second electrically conducting surfaces, the first electrically conductive surfaces and the electrical conductors (and the extreme portions) may be positioned outside of a contour of the central, sensitive portion of the sensor.

In the following, preferred embodiments will be described with reference to the drawing, wherein:

FIG. 1 illustrates a flexible carrier with openings and indexing tracks,

FIG. 2 illustrates an overlap between the carrier and an electronic circuit in a first embodiment, FIG. 3 illustrates an overlap between the carrier and an electronic circuit in a second embodiment, FIG. 4 illustrates an overlap between the carrier and an electronic circuit in a third embodiment, FIG. 5 illustrates a side view of a fourth embodiment, FIG. 6 illustrates a side view of a fifth embodiment, FIG. 7 illustrates a side view of a sixth embodiment, FIG. 8 illustrates the transfer of the circuit to a card body, FIG. 9 illustrates a first embodiment before punching-out, FIG. 10 illustrates the embodiment of FIG. 9 in a first situation after punching out, FIG. 11 illustrates the embodiment of FIG. 9 in a second situation after punching out, FIG. 12 illustrates a second embodiment before punching-out, FIG. 13 illustrates the embodiment of FIG. 12 in a first situation after punching out, FIG. 14 illustrates the embodiment of FIG. 12 in a second situation after punching FIG. 15 illustrates the generation of an elongate carrier from a sheet-shaped element, FIG. 16 illustrates one manner of fixing a circuit to a holder using tape, FIG. 17 illustrates another manner of fixing a circuit to a holder using tape, FIG. 18. illustrates connecting a circuit using wire bonding through a carrier FIGS. 19 and 20 illustrate yet another manner of fixing a circuit in a carrier with a hole.

In FIG. 1, a carrier or holder 12 is illustrated which has a plurality of punched-out holes 121 and an indexing track of holes 122 which are used for translating the carrier 12 using e.g. a toothed wheel so as to know exactly where the carrier 12 is. Thus, from a controlled rotation of the toothed wheel, the position of the carrier 12 and thus of the holes 121 is known. This is a standard method of determining the position of electronic circuits generated on the track for e.g. card production.

In the present context, the carrier 12 is provided by itself and is subsequently attached to the electronic circuits which may then be manufactured anywhere else and using any desired technique.

The carrier 12 may be used for holding the circuits during transport from the assembly of the circuits and the carrier and until later separation thereof for attaching the circuits to other elements, such as for the production of chip cards. The carrier 12 often is bendable, so that the carrier assembly may be rolled up and provided on e.g. a bobbin or the like for easy and safe transport.

In FIG. 2, an electronic circuit 14 is provided over a respective hole 121. The figure illustrates the overlap of the two seen from above, such as when projected on to a plane parallel to the electronic circuit. It is seen that the electronic circuit 14 in FIG. 2 is larger than the hole 121, as it extends outside of the hole to all sides.

In a preferred embodiment, the detachment of the electrical circuit from the carrier 12 is a punching-out of a central portion of the electronic circuit, leaving a remaining portion still attached to the carrier 12. In FIG. 2, the punching contour is seen as 141. Thus, the electronic circuit 14 is deliberately made too large and with dispensable or sacrificial outer portions which may be used for fastening the circuit to the carrier but without which the circuit is fully functional. Thus, the central portion is within the contour 141, and the outer portion is outside of the contour.

Naturally, other manners of separating the outer and central portions may be used, such as cutting, laser cutting or the like.

In FIG. 3, an alternative embodiment is seen where the circuit 14 only extends beyond the hole 121 to the left/right. However, the circuit 14 still may be attached, and the outer portions still removed by e.g. punching out at the contour 141.

In FIG. 4, a similar embodiment is seen where the circuit 14 extends beyond the hole 121 only above and below the hole in the figure. In this embodiment, the punching contour 141, however, is slightly different in that it extends to the upper/lower sides of the circuit 14.

In FIG. 5, a cross section is seen of an embodiment of the assembly of the circuit 14 and the carrier 12. In this embodiment, the circuit 14 has a downwardly extending bump which is provided in the hole 121, where the remainder of the circuit 14 is positioned on top of the carrier 12. The circuit 14 is fastened to the carrier using wires or bonding strings 161. This process may be the same as standard wire bonding and acts to keep the circuit in place until removal.

An alternative could be welding the carrier to the outer portion of the circuit, as this outer portion is usually not required after separation of the central portion.

Naturally, the illustrated bump is not required. The bump may be e.g. an element fastened to the circuit after the generation of the circuit. In one embodiment, the circuit is a fingerprint sensor where the bump is a stiffening element fastened to the sensor after production of the sensor.

Other circuits simply have a rectangular cross section (see e.g. FIG. 9).

Again, the position 141 of the punching is illustrated, if punching is used.

Naturally, other manners may be used for fastening the circuit to the carrier, such as glue, tape or a resin of any kind. This glue may be provided between the circuit 14 and the carrier 12 at the outer portions of the circuit. Alternatively, the glue or the like may be provided on the upper sides thereof. For example, the lines 161 of FIG. 5 may alternatively be the contour of glue fixing the circuit to the carrier, where the glue predominantly (or only) is provided on the upper sides of the elements. Preferably, the glue does not extend over the useful area of the circuit, if the punching out or otherwise separation of a useful portion of the circuit is used from an outer, fixing portion thereof which is sacrificed.

In FIG. 6, another manner is illustrated of fastening the circuit 14 in relation to the carrier 12. In this embodiment, the circuit 14 is positioned in the hole 121 and a tape 162 is provided on one side of the carrier 12. This tape adheres to both the upper side of the carrier 12 and of the circuit 14.

Naturally, the tape 162 could also be used in the situation seen in FIG. 17, where the upper surface of the carrier and circuits is not plane. In this situation, but this could be the situation in general, the tape could be fastened to the circuit and carrier using e.g. a roller forcing the tape toward the circuit but perhaps also the (lower lying) carrier—or an air pressure may force the tape into contact with both the circuit and the carrier. Thus, the tape may fix the circuit to the carrier. Alternatively, the circuit 14 may be fastened to the carrier 12 using localized glue spots 145 provided between the circuit 14 and the carrier 12. In that situation, the tape may be provided for later use.

Also, the tape could be used in the situation seen in FIG. 16, where the tape may be provided on the upper side of the carrier 12. If a hole 121 is desired, the tape may have a corresponding cut-out if no tape is desired on the lower side of the central portion. Alternative, the tape may be unbroken and thus present also covering the hole 121 or cover the surface of the carrier 12 when, as illustrated, not having holes. Then, the tape may be fastened to the central portion by pressurized air (or other elements) forcing the tape toward the central portion.

In one situation, the tape 162 provided on the circuit 14 could be retained during a future transport of the circuit to and fastening thereof in e.g. a card-shaped body, as will be described below.

In FIGS. 19 and 20 another manner of using a tape 162 is seen. Here, the circuit 14 fits in the hole 121 and the tape initially is provided on the upper side of the carrier 12. Forcing the circuit 14 into the hole 121 will force the tape to extend from above the carrier 12 (FIG. 20 from left to right), into the hole 121, under the circuit 14, into the hole 121 again and above the carrier 12. Then, activation, if needed, of the tape 162 will fix the circuit 14 in the hole.

A protective layer 167 may be provided below the circuit 14 to protect the tape 162 at that position in order to keep the tape 162 in a state where it may be activated for fixing the circuit 14 to e.g. a card body or other element. The tape 167 may extend the shelf life of the assembly.

In FIG. 7, yet another manner of fastening the circuit 14 to the carrier 12 is illustrated wherein a tape is positioned on the lower side of the carrier and circuit. In this situation, a punched-out hole of the tape 163 receives the lower bump or element in the circuit. Naturally, this bump need not be there, and the tape may cover (bump or no bump) all of the lower surface of the circuit.

The tape 162 and 163 may be any type of tape, such as so-called blue tape which acts as a standard tape with a flexible material with a glue applied on one side. Another type of tape is the so-called glue tape which is a tape which may be sticky on both sides and thus be used for attaching two elements to each other where the tape is provided between the two elements.

Often, glue tape is heat activated (or UV activated), where the tape may then be called a Heat Activated Foil. Then, the tape may be provided as a non-sticky tape which, when engaging the circuit and/or carrier, may be activated, such as locally by a laser beam or the like, so as to fix the tape to the carrier/circuit. If the glue tape is re-activatable, an activation over the full surface may be allowed, whereas, if it is not re-activatable, a local activation acting to merely fix the circuit to the tape during its presence in the carrier and during a future transport from the carrier to the final card-shaped element 18 may be performed, where the final fixing to the card-shaped body then may a standard activation where a remainder of the glue tape then performs its desired function.

Some glue tapes have the property of being tacky when exposed to a first, lower temperature (above room temperature at which it is not tacky; often around 100° C.; may be called pre-lamination) and becoming activated or very sticky when exposed to a second, higher temperature (often around 200° C.; lamination temperature). Then, the tape may be exposed to the first temperature to fix the circuit to the carrier and the tape to e.g. the central portion and, when fixing to the card body, exposed to the second temperature in order to permanently bond to the card body.

A local activation may be a biasing of the glue tape toward the carrier/circuit and a local heating/irradiation thereof to activate the glue tape at that position. Thus, activation at a number of points or localized areas may be performed in order to ensure attachment between the glue tape and the circuit and/or the carrier.

In general, if glue tape is desired used when fixing the central portion to the card body or whatever other element is desired, the glue tape preferably is attached to the central portion before punching out.

When the circuit is to be removed from the carrier and fixed to another element, such as a card-shaped body, the central portion of the circuit is firstly detached from the carrier. This may be the above punching-out.

As the circuit was positioned in a predetermined manner in relation to the holes 122, its position is well-known so that the punching may be performed in register with the holes 122. Also, an attachment to, gripping of or other engagement of the circuit (before or after removal from the carrier) may be performed in relation to the positions of the holes 122.

Thus, this engagement and gripping is facilitated compared to if the circuit was more loosely positioned in relation to e.g. a plane surface.

The detached circuit then is transferred to a card-shaped body and fixed thereto (see FIG. 8) in any desired manner, such as activation of a glue tape provided between the circuit and the card body.

In FIGS. 9-14, punching-out is illustrated in more detail. The punching tool 13 moves from below the assembly and upwardly, and a counter pressure is formed by the opposing member 131. This is the relative movement, if desired, only the member 131 may move, or both the member 131 and the tool 13 may move. Naturally, the desired profile of the central portion is defined by the tool 13 and member 131. In these figures, the carrier 12 has no holes, so after punching out of the central portion, a portion 122 of the carrier 12 is also punched-out.

It is seen that a portion 142 of the circuit 14 remains attached to the carrier 12 after removal of the central portion 143.

A tool 132, such as a vacuum tool, is used for engaging the central portion 143 and transfer it, for example, to the card body 18 as seen in FIG. 8.

In FIGS. 9-11, the circuit 14 is provided between the carrier 12 and the element 131, whereas in FIGS. 12-14, it is provided between the carrier 12 and the tool 13.

In FIG. 10, the punch tool 13 stops the upward movement at a position where the central portion 143 may be engaged by the tool 132 and removed from the element 131 or where the central portion 143 has been forced out of the element 131. However, the portion 122 remains in the element 131 and thus does not interfere with the removal of the central portion 143. Subsequently, the portion 122 may be removed. This may be obtained by, subsequently to the removal of the central portion 143, moving the tool 13 further upwardly, or by removing the portion 122 using the tool 132 or another tool.

In FIG. 11, the punching tool 13 moves even higher upwardly, so that the portion 122 may be simply removed either by sliding itself down a slanting surface or by e.g. being blown away using an air flow. Naturally, again a tool could be used for removing the portion, whereby the tool 13 need not move further up.

In FIG. 13, the tool 13 again punches out the portion 122 and the central portion 143, but now the portion 122 is the first to leave the element 131. Thus, the tool 132 may be used for firstly removing the portion 122 and then the portion 143.

In FIG. 14, the tool 13 moves further upwardly to first allow the portion 122 to exit the element 131 to be removed, where after the tool 132 engages and removes the central portion 143.

Naturally, when punching-out, an element may be provided for providing a counter-pressure on the punched-out portions 143 and 122 in order to prevent that these elements bend or flex excessively due to the punching-out. Alternatively, the member 131 may move downwardly to achieve that effect.

In FIG. 15, an alternative manner of arriving at the elongate carrier is seen. A sheet-like element 124 is provided which has the holes or tracks 122 provided therein at a number of locations. Also, the holes 121 may be provided if desired, and the circuits are fastened as described above in the desired locations at the holes or otherwise as mentioned above.

It is noted that in this embodiment, the circuits 14 need not have outer, dispensable parts. The circuits 14 may be the circuits desired. Naturally, other elements may also be attached to the element 124 and connected to a circuit. Thus, on the element 24 more complex circuits may be formed of which the circuits 14 form a part. The element 124 may be a printed circuit board having electrical conductors interconnecting these elements and thus forming the more complex circuits.

Having fixed the circuits to the sheet-like element 124, and potentially formed the more complex circuits, the sheet is cut along lines 123 into oblong elements which are subsequently attached at their ends to form an elongate carrier with the tracks 122 and the circuits attached thereto.

Naturally, the order of the steps may be altered, so that the tracks 122 may be provided after fixing of the circuits to the sheet-like element 124, or even after having assembled the oblong elements to the elongate carrier.

Thus, the circuits 14 are fixed to the sheet-like element 124 in a pattern which aligns the circuits into one or a number of parallel sequences of circuits in the final, elongate carrier.

Naturally, the dividing of the sheet-like element 124 into the oblong elements may be performed in any desired manner, such as cutting. The sheet-like element may be made of the same materials, such as a polymer, as the carrier of e.g. FIGS. 1-15 and 16-20.

The interconnection of the oblong elements may be carried out in any desired manner. The ends of the oblong elements may be made to overlap, so that glue may be provided between the elements or welding or a tape may be used. Abutting ends may instead be fastened to each other using tape.

After this, the circuits, such as the above more complex circuits, may be removed. Any of the above removing methods may be used. It is noted that during this removal, a portion of the carrier may remain connected to the circuit and thus form a part of the removed assembly which may then subsequently be provided to or attached to other elements, such as a card body, an RFID element or the like.

In FIG. 18, an alternative manner of providing an assembly may be seen.

Again, the assembly has a circuit 14 and a now a carrier element 12. The carrier element 12 may be the elongate carrier 12 of FIGS. 1-17, but it may also be a much smaller element to which only one circuit 14 is connected.

It is desired that electrical connection is made between the upper side of the circuit 14 to an electrically conducting surface accessible from the upper side of the carrier element 12. Often, a flip-chip technology is used where the electrical connection is made to the lower side of the carrier element 12, but this has been found to be impractical, as the electrical connections have a tendency to break during even slight bending of the assembly.

In this embodiment, the electrical connection to the circuit 14 is by wire bonding through openings or holes 125 provided in the carrier element 12 allowing bonding wires 163 to extend from the upper side of the carrier element 12 to the upper side of the circuit.

The bonding wires may then be connected to electrical conductors formed on the upper side of the carrier element 12, if this carrier element 12 is a PCB. Alternatively, other circuits 165 or the like may be provided at or fastened to the upper side of the carrier element 12, and the bonding wires connected thereto.

However, a bonding wire may alternatively extend through another hole or bore 125' and back toward the lower side of the carrier element 12. Then, a conductive surface 165' may be provided at the lower side of the carrier element, or a second circuit or chip may be provided below the carrier element and at the lower side, so that the bonding wire may connect to such conductive surface or chip.

In one embodiment, the circuit 14 is a capacitive finger print sensor capable of sensing the finger print through the carrier element 12 and which has an upwardly directed sensitive region 145 at a centre thereof but has a plurality, such as two, connection pads also on the upper side of the circuit 14. Then, it is desired that the wires 163 extend from the outer portions of the upper side of the circuit 14 through the holes 125 in the carrier element 12 and away from the sensitive portion 145 in order to not interfere with the finger print reader operation.

In this respect, it is desired that the carrier element 12 does not have any electrically conducting elements at or over the sensitive portion 145. The wires 163 thus are connected to electrical connectors, such as pads, of the carrier element 12—or other elements—at positions away from the sensitive portion. Such positions may be determined when projected on to a plane parallel to a surface of the carrier element.

Naturally, the circuit may be attached to the carrier element using any desired fixing manner, such as gluing, welding or the like. As the electrical connections are taken care of by the wires, a resilient fixing manner may be used, such as using a glue which retains some resiliency. Alternatively, the wires may be used for fixing the circuit to the carrier element. The wires will allow slight movement of the circuit in relation to the carrier element so that bending will be allowed without destroying the electrical connection.

EMBODIMENTS

1. A method of providing an assembly, the method comprising:
    obtaining a plurality of electrical circuits each having an outer portion and a central portion,
    obtaining an elongated holder defining a predetermined axis,
    fixing the outer portions of each circuit to the holder and removing the central portions of the circuits from the holder while the outer portions are fixed to the holder.

2. A method according to embodiment 1, wherein the holder comprises a plurality of equally spaced markings positioned along a longitudinal axis parallel to the predetermined axis and wherein each electronic circuit is positioned in a predetermined manner in relation to a respective marking.

3. A method according to any of the preceding embodiments, wherein the removal step comprises severing the central portions from the outer portions along a direction perpendicular to a plane of the holder.

4. A method according to any of the preceding embodiments, wherein the removing step comprises punching out the central portion of each electrical circuit.

5. A method according to embodiment 3 or 4, wherein the severing or punching-out comprises severing or punching-out a portion of the holder at each central portion and a subsequent removal/discarding of the portion of the holder.

6. A method according to embodiment 5, further comprising the step of, pursuant to the severing/punching step, engaging the central portion by an instrument.

7. A method according to embodiment 6, wherein the removing/discarding step comprises the removing/discarding the portion using the instrument.

8. A method according to embodiment 7, wherein the instrument engages each central portion from a first side of the holder, and wherein the removal/discarding step is performed before the engaging step.

9. A method according to embodiment 7, wherein the instrument engages each central portion from a second side of the holder, and wherein the removal/discarding step is performed subsequent to the engaging step.

10. A method according to any of the preceding embodiments, wherein the holder further comprises a plurality of cavities or holes, and wherein the fixing step comprises fixing each circuit in or at a cavity or hole.

11. A method according to embodiments 10 and 2, wherein the cavities or holes are positioned along the predetermined axis relative to the holder and wherein each cavity/hole is positioned in a predetermined manner in relation to a respective marking.

12. A method according to any of the preceding embodiments, wherein the fixing step comprises gluing each circuit to the holder.

13. A method according to any of the preceding embodiments, wherein the fixing step comprises wire-bonding each circuit to the holder.

14. A method according to any of the preceding embodiments, wherein the fixing step comprises press-fitting each circuit to the holder.

15. A method according to any of the preceding embodiments, wherein the fixing step comprises attaching a tape to the holder and the circuits.

16. A method according to embodiment 15, wherein the attaching step comprises locally activating the tape at positions of engagement of the tape and the circuits and positions of engagement of the tape and the holder.

17. A method according to embodiment 15, further comprising the step of, pursuant to the removing step, attaching each central portion of a circuit to a respective card body, wherein the attaching step comprises:
   positioning the tape between the circuit and the card body and
   activating portions of the tape.

18. A method according to any of the preceding embodiments, further comprising the step of, pursuant to the removing step, attaching each central portion of a circuit to a respective card body.

19. An assembly of an elongated holder and a plurality of circuits obtained by the obtaining steps and the fixing step of the method of any of the preceding embodiments.

20. An elongated, flexible/bendable element comprising:
   an elongated holder defining a predetermined axis,
   a plurality of electrical circuits each having a central portion and an outer portion, each circuit being fixed to the holder only at its outer portions.

21. An assembly according to embodiment 20, wherein the holder comprises a plurality of equally spaced markings positioned along a longitudinal axis parallel to the predetermined axis and wherein each electronic circuit is positioned in a predetermined manner in relation to a respective marking.

22. An assembly according to embodiment 20 or 21, wherein the holder further comprises a plurality of cavities or holes, and wherein each circuit is fixed in or at a cavity or hole.

23. An assembly according to embodiment 22, wherein the cavities/holes are positioned equidistantly along a predetermined axis and wherein the markings are positioned along a longitudinal axis parallel to the predetermined axis.

24. An assembly according to any of embodiments 20-23, wherein the cavities/holes are positioned with a first predetermined distance, and wherein the markings are positioned with a second predetermined distance, the first predetermined distance being an integer of the second predetermined distance.

25. An assembly according to any of embodiments 20-24, wherein each circuit is positioned in a predetermined manner in relation to a respective one of the markings.

26. An assembly according to any of embodiments 20-25, wherein each circuit is glued to the holder.

27. An assembly according to any of embodiments 20-26, wherein each circuit is wire-bonded to the holder.

28. An assembly according to any of embodiments 20-27, wherein each circuit is press-fitted to the holder.

29. An assembly according to any of embodiments 20-28, further comprising a tape attached to the holder and the circuits.

30. An assembly according to any of embodiments 20-29, further comprising a tape attached to a side of the circuits facing away from the holder.

31. A method of obtaining an elongate carrier with a plurality of circuits, the method comprising:
   providing a sheet-shaped element,
   providing a plurality of circuits,
   fixing each circuit to the sheet-shaped element,
   dividing, subsequent to the fixing step, the sheet-shaped element into a plurality of oblong elements,
   interconnecting the oblong elements to form an elongate carrier.

32. A method according to embodiment 31, further comprising, subsequent to the interconnecting step, the step of removing the circuits from the elongate holder.

33. A method according to embodiment 31 or 32, wherein the oblong elements each comprises a plurality of equally spaced markings positioned along a longitudinal axis parallel to the predetermined axis and wherein each circuit is positioned in a predetermined manner in relation to a respective marking.

34. A method according to embodiment 32, wherein the circuits comprise a central portion and outer portions, where the fixing step comprises fixing the outer portions to the holder, and wherein removal step comprises severing the central portions from the outer portions along a direction perpendicular to a plane of the carrier.

35. A method according to embodiment 32, wherein the removing step comprises punching out each circuit.

36. A method according to embodiment 34 or 35, wherein the severing or punching-out comprises severing or punching-out a portion of the carrier at each circuit and a subsequent removal/discarding of the portion of the carrier.

37. A method according to embodiment 36, further comprising the step of, pursuant to the severing/punching step, engaging the circuit by an instrument.

38. A method according to embodiment 37, wherein the removing/discarding step comprises the removing/discarding the portion using the instrument.

39. A method according to embodiment 38, wherein the instrument engages each circuit from a first side of the holder, and wherein the removal/discarding step is performed before the engaging step.

40. A method according to embodiment 38, wherein the instrument engages each circuit rom a second side of the holder, and wherein the removal/discarding step is performed subsequent to the engaging step.

41. A method according to any of embodiments 31-40, wherein the sheet-shaped element further comprises a plurality of cavities or holes, and wherein the fixing step comprises fixing each circuit in or at a cavity or hole.

42. A method according to embodiments 41 and 33, wherein the cavities or holes are positioned along the predetermined axis relative to the holder and wherein each cavity/hole is positioned in a predetermined manner in relation to a respective marking.

43. A method according to any of embodiments 31-42, wherein the fixing step comprises gluing each circuit to the sheet-shaped element.

44. A method according to any of embodiments 31-43, wherein the fixing step comprises wire-bonding each circuit to the sheet-shaped element.

45. A method according to any of embodiments 31-44, wherein the fixing step comprises press-fitting each circuit to the sheet-shaped element.

46. A method according to any of embodiments 31-45, wherein the fixing step comprises attaching a tape to the sheet-shaped element and the circuits.

47. A method according to embodiment 46, wherein the attaching step comprises locally activating the tape at positions of engagement of the tape and the circuits and positions of engagement of the tape and the holder.

48. A method according to embodiment 46 and 32, further comprising the step of, pursuant to the removing step, attaching each circuit to a respective card body, wherein the attaching step comprises:
    positioning the tape between the circuit and the card body and
    activating portions of the tape.

49. A method according to embodiment 32, further comprising the step of, pursuant to the removing step, attaching each circuit to a respective card body.

50. An assembly of a circuit and a carrier element, wherein:
    the carrier element has:
        a first and a second, opposite side,
        one or more first electrically conducting surfaces, and
        one or more through-going holes from the first side to the second side,
    the circuit has one or more second electrical conducting surfaces at a first side thereof, the first side of the circuit facing the second side of the carrier and
    one or more electrical conductors each extending from a respective second electrical conducting surface of the circuit, through a respective hole and to a respective first electrically conducting surface.

51. An assembly according to embodiment 50, wherein the circuit is fixed to the carrier element.

52. An assembly according to embodiment 51, further comprising glue fixing the circuit to the carrier element.

53. An assembly according to any of embodiments 50-52, wherein the circuit is a sensor.

The invention claimed is:

1. A method of providing an assembly, the method comprising:
    obtaining a plurality of electrical circuits each having an outer portion and a central portion,
    obtaining an elongated holder defining a predetermined axis,
    fixing the outer portion of each electrical circuit to the elongated holder, and
    removing the central portions of the electrical circuits from the elongated holder and leaving the outer portions of the electrical circuits fixed to the elongated holder.

2. A method according to claim 1, wherein the elongated holder comprises a plurality of equally spaced markings positioned along a longitudinal axis parallel to the predetermined axis and wherein each electrical circuit is positioned in a predetermined manner in relation to a respective marking.

3. A method according to claim 1, wherein the removing step comprises severing the central portions from the outer portions along a direction perpendicular to a plane of the elongated holder.

4. A method according to claim 1, wherein the elongated holder further comprises a plurality of cavities or holes, and wherein the fixing step comprises fixing each electrical circuit in or at a cavity or hole.

5. An assembly of an elongated holder and a plurality of electrical circuits obtained by the method of claim 1.

6. A method of obtaining an elongate carrier with a plurality of circuits, the method comprising:
    providing a sheet-shaped element,
    providing the plurality of circuits each having a central portion and an outer portion,
    fixing the outer portion of each circuit to the sheet-shaped element,
    dividing, subsequent to the fixing step, the sheet-shaped element into a plurality of oblong elements,
    interconnecting the oblong elements to form the elongate carrier.

7. A method according to claim 6, further comprising removing the central portions of the circuits from the elongate carrier while the outer portions of the circuits are fixed to the elongate carrier.

8. A method according to claim 7, wherein the circuits comprise a central portion and outer portions, where the fixing step comprises fixing the outer portions to the elongate carrier, and wherein the removing step comprises severing the central portions from the outer portions along a direction perpendicular to a plane of the elongate carrier.

* * * * *